(12) United States Patent
Jeon et al.

(10) Patent No.: US 7,058,875 B2
(45) Date of Patent: Jun. 6, 2006

(54) METHOD OF CORRECTING DATA ON A HIGH-DENSITY RECORDING MEDIUM

(75) Inventors: Ik Beom Jeon, Seoul (KR); Sang Woon Suh, Seoul (KR)

(73) Assignee: LG Electronics Inc., Seoul (KR)

( * ) Notice: Subject to any disclaimer, the term of this patent is extended or adjusted under 35 U.S.C. 154(b) by 134 days.

(21) Appl. No.: 10/494,295

(22) PCT Filed: Sep. 2, 2003

(86) PCT No.: PCT/KR03/01792

§ 371 (c)(1),
(2), (4) Date: Jul. 6, 2004

(87) PCT Pub. No.: WO2004/021619

PCT Pub. Date: Mar. 11, 2004

(65) Prior Publication Data

US 2005/0144550 A1     Jun. 30, 2005

(30) Foreign Application Priority Data

Sep. 2, 2002  (KR) .................. 10-2002-0052474

(51) Int. Cl.
*G11C 29/00* (2006.01)

(52) U.S. Cl. ..................................................... 714/769
(58) Field of Classification Search ............... 714/769
See application file for complete search history.

(56) References Cited

U.S. PATENT DOCUMENTS

| 5,835,509 A | * | 11/1998 | Sako et al. | 714/755 |
| 6,604,217 B1 | * | 8/2003 | Kahlman | 714/752 |
| 6,918,079 B1 | * | 7/2005 | Kawamae et al. | 714/769 |

FOREIGN PATENT DOCUMENTS

| JP | 06-243592 A | 9/1994 |
| JP | 13-14812 A | 1/2001 |

* cited by examiner

*Primary Examiner*—Shelly Chase
(74) *Attorney, Agent, or Firm*—Birch, Stewart, Kolasch & Birch, LLP

(57) ABSTRACT

The present invention relates to a method of correcting data on a high-density recording medium such as a BD-ROM (Blu-ray ROM Disk) and a BD-RW (Blu-ray ReWritable Disk). In the present method, whether there is any error in a predetermined-sized LDC data block, which is included in a physical cluster, is determined based on if there is an error in sync data and BIS data neighboring the LDC data block, and, if determined to be erroneous, error correcting operation for the LDC block is conducted.

5 Claims, 5 Drawing Sheets

METHOD OF CORRECTING DATA ON A HIGH-DENSITY RECORDING MEDIUM

TECHNICAL FIELD

The present invention relates to a method of correcting errors in data recorded on a high-density recording medium such as a BD-RW disk or a BD-ROM disk.

BACKGROUND ART

The standardization of new high-density read only and rewritable optical disks capable of recording large amounts of high-quality video and audio data has been progressing rapidly and new optical disk related products are expected to be commercially available on the market in the near future. The Blu-ray Disc Rewritable (BD-RW) and Blu-ray Disk ROM (BD-ROM) are examples of these new optical disks.

As shown in FIG. 1, user data such as A/V data and various contents is encoded through multiple data processing steps to be recorded on the BD-RW. User data of a predetermined size is converted into data frames, scrambled data frames, a data block, a long distance code (LDC) block, and a long distance code (LDC) cluster in turn.

Similarly, user control data corresponding to the user data is converted into an access block, a burst indicating sub-code (BIS) block, and a burst indicating sub-code (BIS) cluster in turn.

As shown, a BIS cluster encoded in this manner is divided into 3 parts of the same size and each part is inserted between two data blocks of an LDC cluster, each data block being of a predefined size. Sync data is added to one LDC cluster and one BIS cluster recorded in this manner, which constitutes one physical cluster.

As shown in FIG. 2, one physical cluster comprises 155 columns (sync data exclusive) and 496 rows. In each 10 row, sync data has a size of 20 bits, each of the first-column through fourth-column LDC data blocks has a size of 38 bytes, and each of the first-column through third-column BIS data blocks has a size of 1 byte. An Error in each 1-byte BIS data block can be detected by conventional Reed Solomon (RS) decoding sequences.

If there are errors in the BIS data, for example, there are errors in both of the BIS data adjacent to an LDC data block of size 38 bytes as shown in FIG. 2, it is concluded that the LDC data block contains an error and the LDC data block is marked as erasure to indicate the existence of the error.

Error correction can be done on the LDC data block marked as erasure during RS decoding operation. Consequently, an error in the LDC data that might be caused by scratches, fingerprints, etc can be corrected and user data can be normally reproduced.

The above-mentioned error correction method is only applicable to LDC data blocks in the second or third column because a data error is detected only when both BIS data blocks adjacent to an LDC data block contain errors. As shown in FIG. 2, an LDC data block (202) in the first column and an LDC data block (201) in the fourth column are adjacent to sync data and therefore error detection and error correction for those data blocks cannot be conducted.

DISCLOSURE OF INVENTION

It is an object of the present invention to provide a method of correcting errors in data recorded on a high-density recording medium that provides more accurate error correction by detecting an error occurring in an LDC data block based on errors in sync data and BIS data adjacent to the LDC data block.

A method of correcting errors in data recorded on a high-density recording medium in accordance with the invention is characterized in that it comprises the steps of: determining whether an error exists in a long distance code block of a predefined size contained in a physical cluster being reproduced from the high-density recording medium based on whether errors exist in burst indicating sub-code data and sync data adjacent to the long distance code block; and selectively performing an error correction operation for the long distance code block depending on the determination result.

The above-characterized present invention makes it possible to detect and correct errors in all LDC data blocks in a physical cluster that might be caused by scratches, fingerprints, etc.

MODES FOR CARRYING OUT THE INVENTION

In order that the invention may be fully understood, preferred embodiments thereof will now be described with reference to the accompanying drawings.

Figure 1:
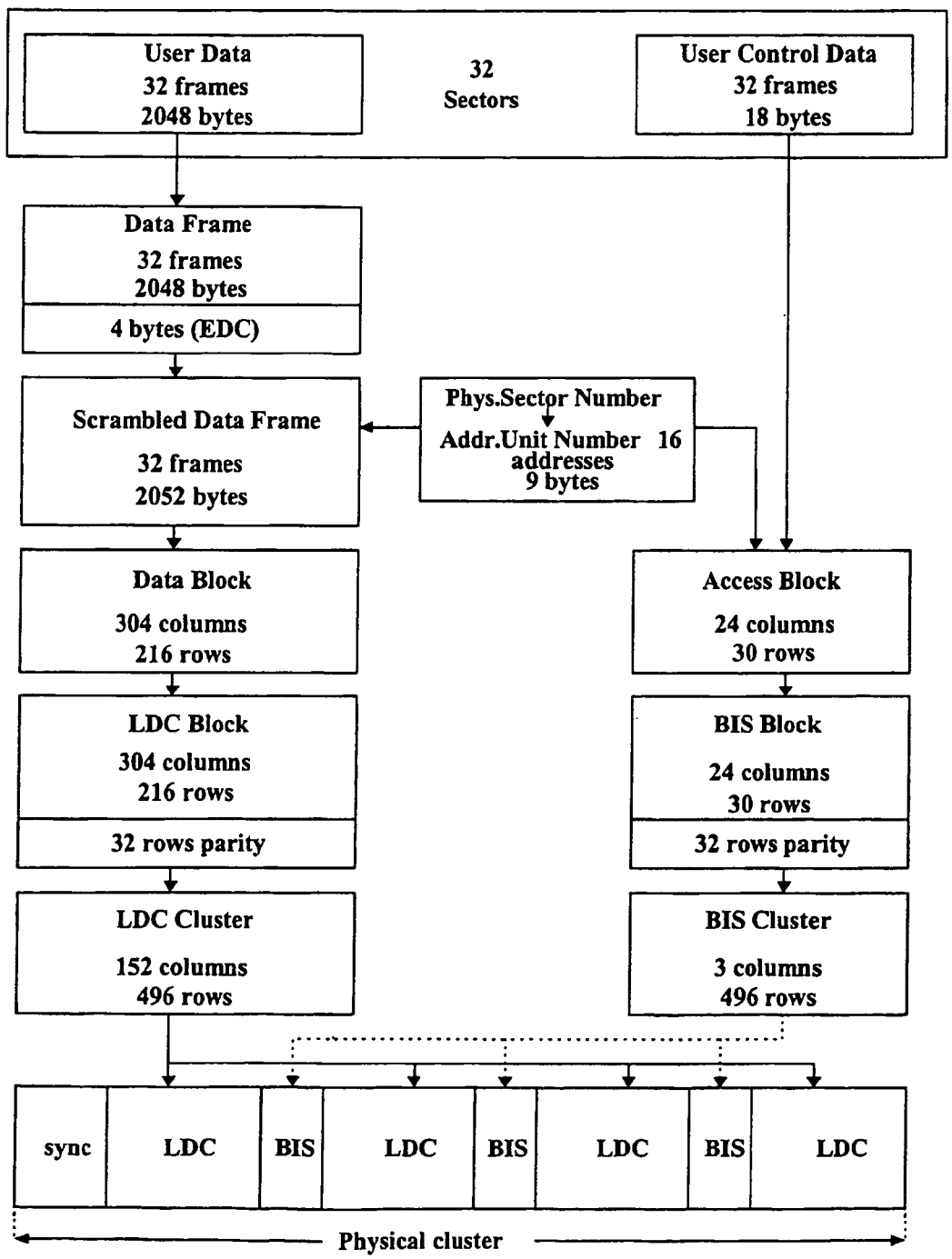
FIG. 1 illustrates the process of encoding a physical cluster of the Blu-ray Disk Rewritable (BD-RW)
Figure 2:
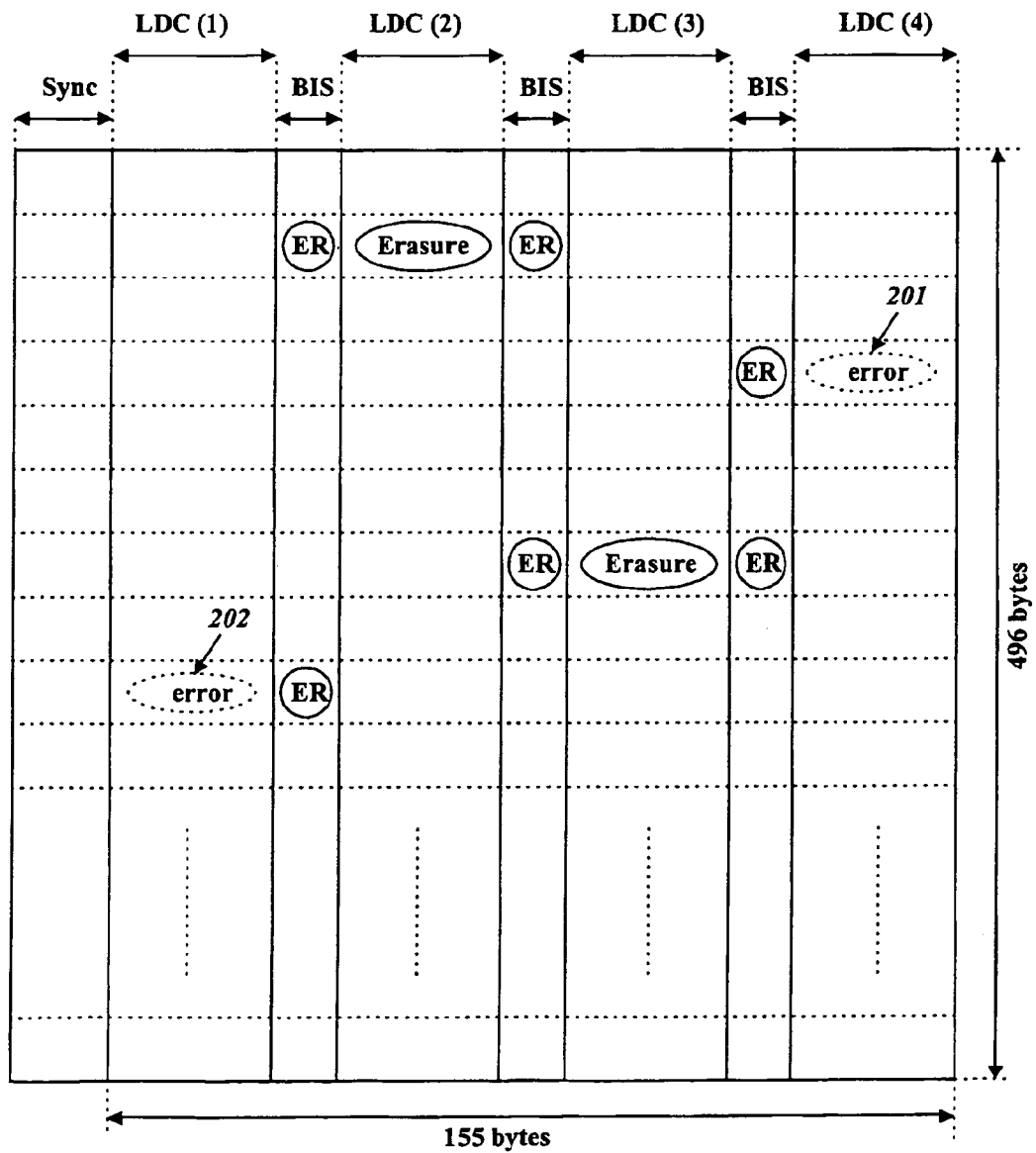
FIG. 2 illustrates the process of decoding a physical cluster of the Blu-ray Disk Rewritable (BD-RW)
Figure 3:
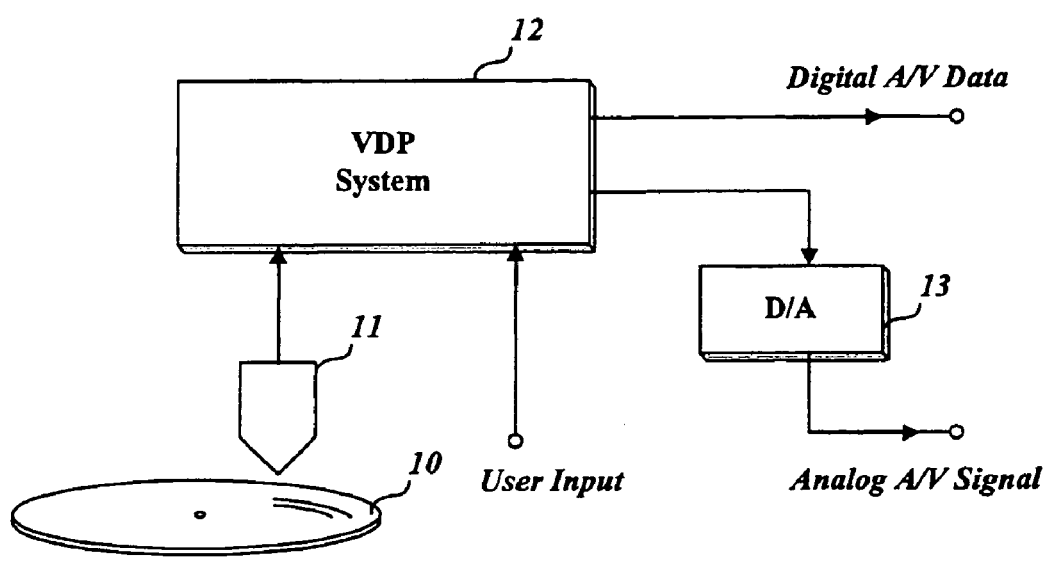
FIG. 3 illustrates a schematic diagram of an optical disk reproducing apparatus in which the present invention may be advantageously embodied.

FIG. 3 illustrates a schematic diagram of an optical disk reproducing apparatus in which the present invention may be advantageously embodied. The apparatus comprises an optical pickup 11 for reproducing recorded signals from an optical disk 10 such as a BD-RW disk or a BD-ROM disk, a VDP system 12 for converting the reproduced signal into a binary signal, retrieving digital data from the binary signal, decoding the digital data, correcting errors in data, and controlling the overall decoding operation, and a D/A converter 13 for converting decoded digital data into analog signals. The VDP system 12 responsive to a user request performs reproduction of the optical disk 10 loaded into the apparatus.

Figure 4:
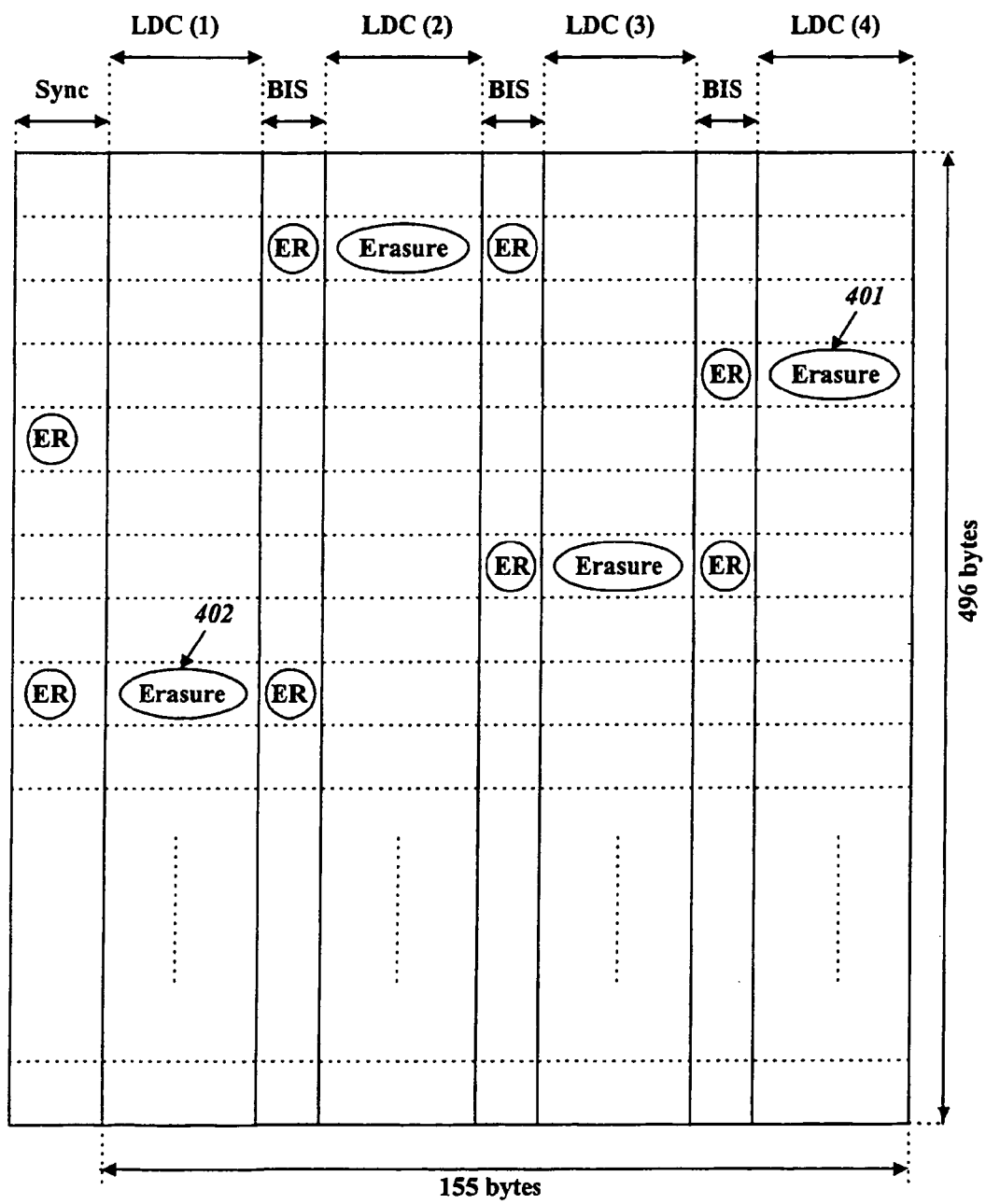
FIG. 4 illustrates the process of decoding a physical cluster of the Blu-ray Disk Rewritable (BD-RW) in accordance with the invention.

As shown in FIG. 4, it is determined whether an error occurs in an LDC data block of size 38 bytes in the second or third column based on errors in two BIS data blocks adjacent to the LDC data block. And, it is determined whether an error occurs in an LDC data block of size 38 bytes in the first or fourth column based on errors in a BIS data block and sync data adjacent to the LDC data block.

If an LDC data block is concluded to be erroneous, the LDC data block is marked as erasure to indicate that an error occurs and an RS decoding is performed on the LDC data block, thereby correcting the error that might be caused by scratches, fingerprints, etc.

Figure 5:
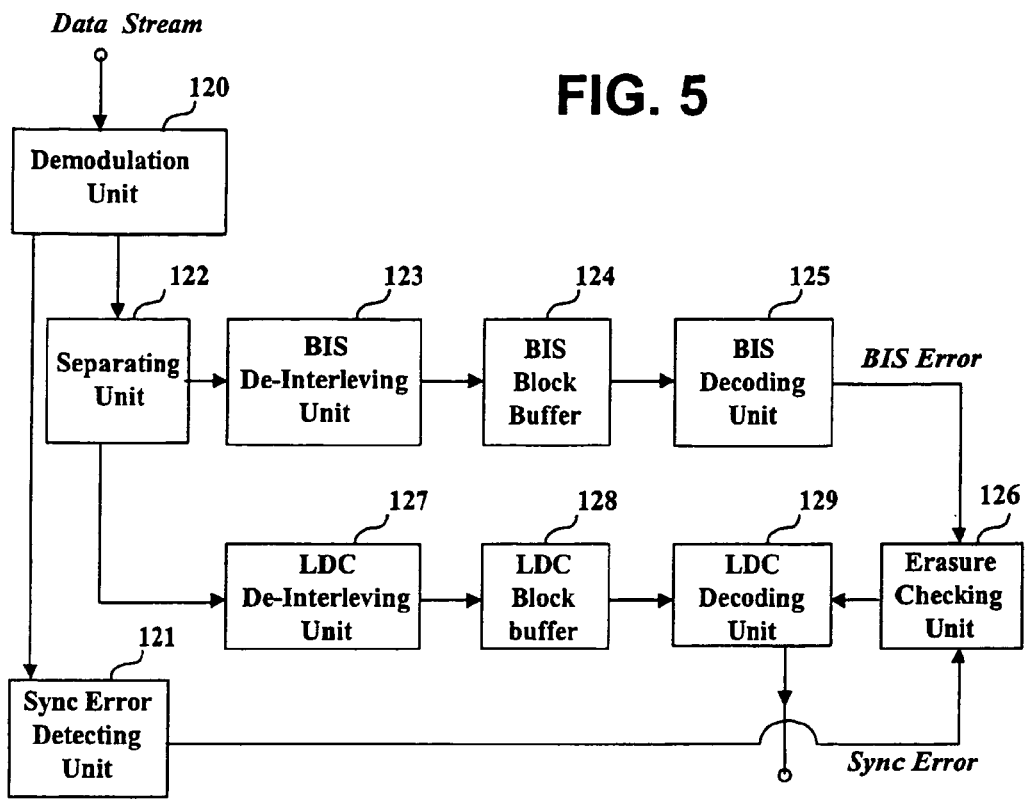
FIG. 5 illustrates a detailed block diagram for explaining the method of correcting errors in accordance with the invention.

As shown in FIG. 5, the VDP system 12 comprises a plurality of conceptional blocks: a demodulation unit 120, a sync error detecting unit 121, a separating unit 122, a BIS deinterleaving unit 123, a BIS block buffer 124, a BIS decoding unit 125, an erasure checking unit 126, an LDC deinterleaving unit 127, an LDC block buffer 128, and an LDC decoding unit 129. The sync error detecting unit 121 detects 20-bit sync data from a data stream demodulated by the demodulation unit 120 and compares the detected sync data with preset predictive sync data to determine whether an error occurs in the sync data.

The separating unit 122 separates the data stream from the demodulation unit 120 into BIS data and LDC data. The BIS deinterleaving unit 123 deinterleaves the BIS data and stores the BIS data in the BIS block buffer 124. The BIS decoding unit 125 performs RS decoding operations on the BIS data stored in the BIS block buffer 124 to determine whether an error occurs as shown in FIG. 4. The determination result is sent to the erasure checking unit 126.

Receiving determination results from the BIS decoding unit 125 and the sync error detecting unit 121, the erasure checking unit 126 determines whether to mark an LDC data block as erasure. The LDC deinterleaving unit 127 deinterleaves LDC data from the separating unit 122 and stores the LDC data in the LDC block buffer 128. The LDC decoding unit 128 performs RS decoding operations on the LDC data stored in the LDC block buffer 128. If the LDC data block is marked as erasure by the erasure checking unit 126, an error correction operation for the LDC data block of size 38 bytes is conducted. Consequently, it is possible to correct an error occurring in an LDC data block in every column.

Figure 6:
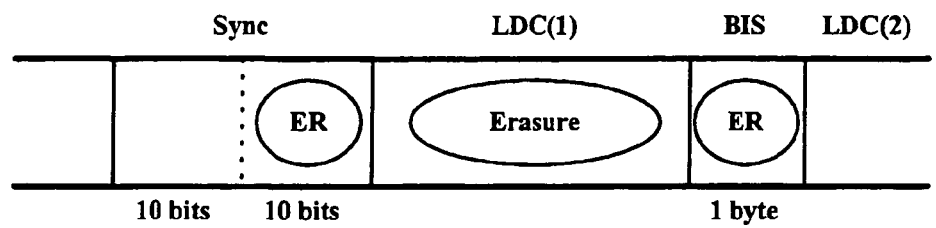
FIG. 6 illustrates an exemplary embodiment of correcting errors in accordance with the invention.
Figure 6:
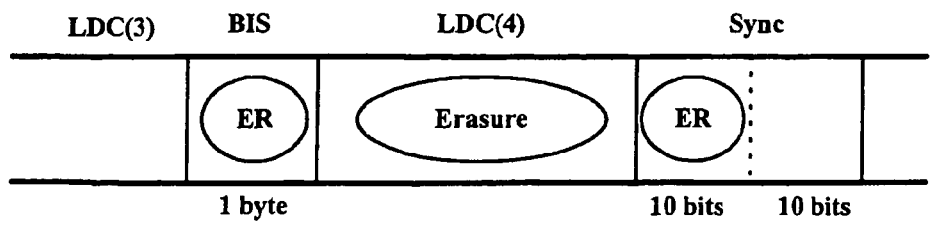

The sync error detecting unit 121 can divide 20-bit sync data into two 10-bit half blocks and detect an error in each 10-bit half block individually. As shown in FIG. 6, an error in the first half can be used to determine whether an error exists in a preceding LDC data adjacent to the sync data, i.e., an LDC data in the fourth column. Likewise, an error in the second half can be used to determine whether an error exists in a following LDC data adjacent to the sync data, i.e., an LDC data in the first column.

While the invention has been disclosed with respect to a limited number of embodiments, those skilled in the art, having the benefit of this disclosure, will appreciate numerous modifications and variations therefrom. It is intended that all such modifications and variations fall within the spirit and scope of the invention.

The invention claimed is:

1. A method of correcting errors in data recorded on a high-density recording medium, comprising the steps of:
   (a) determining whether an error exists in a long distance code block of a predefined size contained in a physical cluster being reproduced from the high-density recording medium based on whether errors exist in burst indicating sub-code data and sync data adjacent to the long distance code block; and
   (b) selectively performing an error correction operation for said long distance code block depending on the determination result.

2. The method set forth in claim 1, wherein said step (a) concludes that an error exists in said long distance code block if errors occur in both said burst indicating sub-code data and said sync data and marks said long distance code block as erasure to indicate the error.

3. The method set forth in claim 1, wherein a portion of said sync data is used to determine whether an error occurs in a preceding long distance code block adjacent to said sync data and the other portion of said sync data is used to determine whether an error occurs in a following long distance code block adjacent to said sync data.

4. The method set forth in claim 1, wherein said high-density recording medium is either a Blu-ray disk rewritable disk or a Blu-ray ROM disk.

5. The method set forth in claim 1, further comprising the step of (c) determining whether an error exists in said long distance code block based on whether an error exists in preceding and/or following burst indicating sub-code data adjacent to said long distance code block.

* * * * *